US012672581B2

(12) United States Patent
Zhang et al.

(10) Patent No.: US 12,672,581 B2
(45) Date of Patent: Jun. 30, 2026

(54) MESA DEVICE WITH STACK THIN FILM PASSIVATION

(71) Applicant: Littelfuse Semiconductor (Wuxi) Co., Ltd., Wuxi (CN)

(72) Inventors: Glenda Zhang, Wuxi (CN); Lucas Zhang, Wuxi (CN); Lei He, Wuxi (CN)

(73) Assignee: Littelfuse Semiconductor (Wuxi) Co., Ltd., Wuxi (CN)

( * ) Notice: Subject to any disclaimer, the term of this patent is extended or adjusted under 35 U.S.C. 154(b) by 359 days.

(21) Appl. No.: 18/229,501

(22) Filed: Aug. 2, 2023

(65) Prior Publication Data

US 2024/0055312 A1      Feb. 15, 2024

(30) Foreign Application Priority Data

Aug. 10, 2022    (CN) .......................... 202222104140.6

(51) Int. Cl.
H10W 74/10        (2026.01)
H10D 8/00         (2025.01)
H10W 74/40        (2026.01)
H10W 74/43        (2026.01)

(52) U.S. Cl.
CPC ....... H10W 74/137 (2026.01); H10W 74/147 (2026.01); H10W 74/481 (2026.01); H10D 8/422 (2025.01); H10W 74/43 (2026.01)

(58) Field of Classification Search
CPC ............ H01L 23/3178; H01L 23/3192; H01L 23/3171; H01L 23/291; H10D 8/422; H10D 62/104; H10D 8/045
See application file for complete search history.

(56) References Cited

U.S. PATENT DOCUMENTS

| | | | | |
|---|---|---|---|---|
| 5,637,908 A * | 6/1997 | Lowther | ................ | H10D 30/65 |
| | | | | 257/E29.256 |
| 2002/0022315 A1* | 2/2002 | Bronner | .............. | H10W 20/076 |
| | | | | 257/296 |
| 2021/0280698 A1* | 9/2021 | Hauttecoeur | .......... | H10D 18/00 |

FOREIGN PATENT DOCUMENTS

| | | |
|---|---|---|
| CN | 108735599 A | 11/2018 |
| CN | 113161238 A | 7/2021 |

OTHER PUBLICATIONS

European Search Report for EP Application No. 23188719.1, Jan. 4, 2024, 8 pages.

* cited by examiner

*Primary Examiner* — Moazzam Hossain
(74) *Attorney, Agent, or Firm* — KDW Firm PLLC

(57)        ABSTRACT
An overvoltage protection device may include an n-type semiconductor substrate, a p-type layer disposed atop the n-type semiconductor substrate, and a passivation region formed in the n-type semiconductor substrate and the p-type layer, wherein the passivation region comprises a semi-insulating polycrystalline silicon (SIPOS) layer.

4 Claims, 2 Drawing Sheets

<u>200</u>

MESA DEVICE WITH STACK THIN FILM PASSIVATION

FIELD OF THE DISCLOSURE

Embodiments relate to the field of circuit protection devices and, more particularly, to a semiconductor device for protection against transient overvoltages.

BACKGROUND OF THE DISCLOSURE

Semiconductor devices are widely used to provide protection against transient conditions, such as transient overvoltage events by taking advantage of the properties of P/N junctions. In a P/N junction, an interface is formed between a region of the semiconductor device having a first conductivity type (P or N) and a second region having a second conductivity type opposite the first conductivity type (N or P). To form some conventional transient protection devices, a semiconductor substrate having a conductivity of a first type is exposed to implantation, diffusion, or deposition of species of a second type, including epitaxial growth of a layer having species of the second type. After the species of the second type is provided, annealing may be performed to diffuse and activate the species of second conductivity type.

Oftentimes, a glass passivation layer is provided in a passivation area of the device. However, the glass passivation layer is susceptible to cracking. It is with respect to this and other considerations that the present improvements are provided.

SUMMARY OF THE DISCLOSURE

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one approach according to the present disclosure, an overvoltage protection device may include an n-type semiconductor substrate, a p-type layer disposed atop the n-type semiconductor, and a passivation region formed in the n-type semiconductor substrate and the p-type layer, wherein the passivation region comprises a semi-insulating polycrystalline silicon (SIPOS) layer.

In another approach, a method of forming an overvoltage protection device or a power device may include forming a p-type layer disposed atop an n-type semiconductor, and forming a passivation region in the n-type semiconductor substrate and the p-type layer, wherein the passivation region comprises a semi-insulating polycrystalline silicon (SIPOS) layer.

In another approach, a mesa structure overvoltage protection device may include an n-type semiconductor substrate, a p-type layer disposed atop the n-type semiconductor, and a passivation region formed in the n-type semiconductor substrate and the p-type layer, wherein the passivation region comprises a semi-insulating polycrystalline silicon (SIPOS) layer along an upper surface of the passivation region.

BRIEF DESCRIPTION OF THE DRAWINGS

The accompanying drawings illustrate exemplary approaches of the disclosed embodiments so far devised for the practical application of the principles thereof, and in which.

Figure 1:
FIG. 1 is a partial side view of an overvoltage protection device according to embodiments of the present disclosure.
Figure 1:
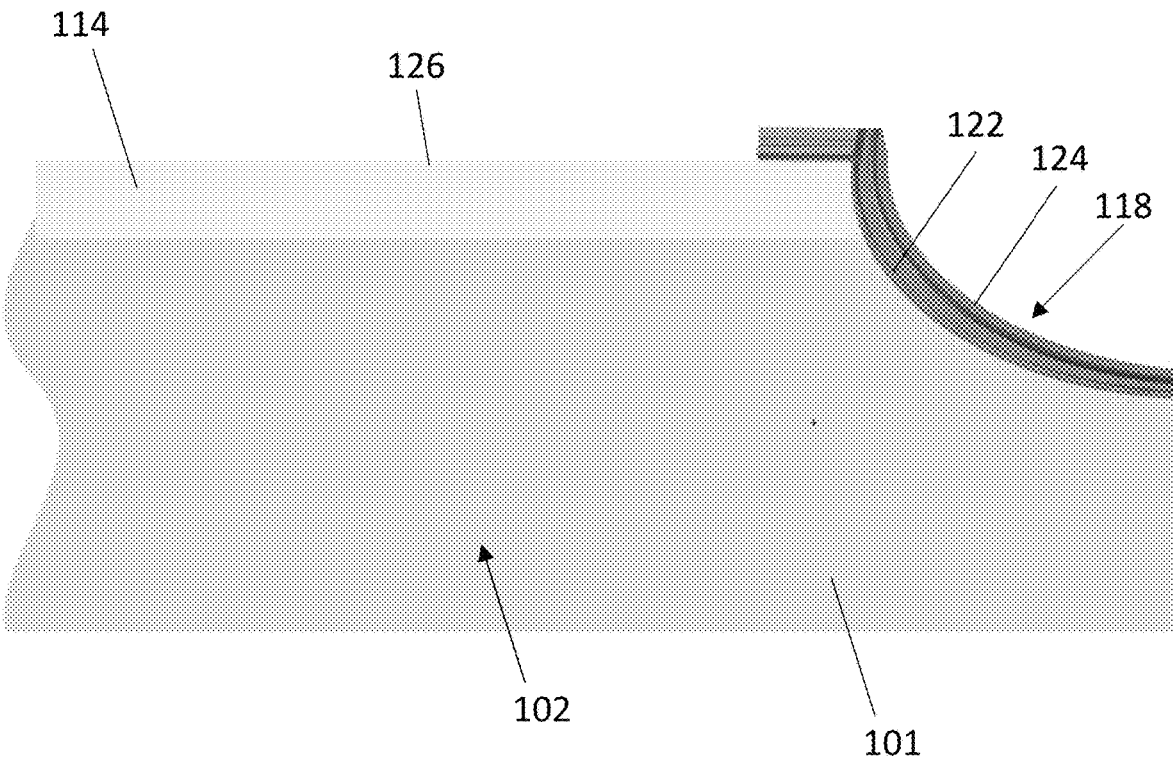

The drawings are not necessarily to scale. The drawings are merely representations, not intended to portray specific parameters of the disclosure. The drawings are intended to depict typical embodiments of the disclosure, and therefore should not be considered as limiting in scope. In the drawings, like numbering represents like elements. Furthermore, certain elements in some of the figures may be omitted, or illustrated not-to-scale, for illustrative clarity. Furthermore, for clarity, some reference numbers may be omitted in certain drawings.

DETAILED DESCRIPTION

The present embodiments will now be described more fully hereinafter with reference to the accompanying drawings, in which various embodiments are shown. The embodiments may be embodied in many different forms and are not to be construed as limited to the embodiments set forth herein. These embodiments are provided so that this disclosure will be thorough and complete, and will fully convey the scope of the embodiments to those skilled in the art. In the drawings, like numbers refer to like elements throughout.

The present embodiments are generally related to transient protection devices formed within a semiconductor substrate. The present embodiments may also be used for power devices, which need high blocking voltage. Various embodiments involve a multilayer device structure and method of forming the device structure (hereinafter "device"). The device may include one or more passivation regions including a semi-insulating polycrystalline silicon (SIPOS) layer. In some embodiments, the device may be formed by providing a semiconductor substrate that is doped using a first dopant type. A second dopant type may be introduced into opposite sides of the semiconductor substrate to form a PNP or NPN device structure that is made of multiple semiconductor layers. The device layers are part of a high-voltage rectifier diode.

Turning now to FIG. 1, the device 100 will be describe in greater detail. As shown, the device 100 may be formed from a semiconductor substrate 101 that includes a body region 102, where the body region 102 is formed by doping the semiconductor substrate 101. In some embodiments, the body region 102 may be n-doped having a concentration of n-type dopants between $1E13/cm^3$ to $1E16/cm^3$. In particular embodiments, the dopant concentration in the body region 102 may be tailored to generate a resistance in the range of 1 Ohm-cm to 5 Ohm-cm, corresponding to an n-type dopant level of $1E16/cm^3$ to $1/E14/cm^3$, for example. The embodiments are not limited in this context, however. In particular embodiments, the body region may be doped using phosphorous.

As shown, the device 100 further includes a p-type layer 114 disposed atop the n-type semiconductor 101. In accordance with some embodiments, the p-type layer 114 may comprise boron-doped regions having an active dopant concentration (the term "dopant concentration" may mean "active dopant concentration" unless otherwise noted herein) of between $1E18/cm^3$ and $1E21/cm^3$. The embodiments are not limited in this context.

In accordance with various embodiments, the p-type layer 114 may be formed by a plurality of drive-in operations. In conjunction with a given drive-in operation, a dopant may be introduced to the semiconductor substrate 101 by exposure to an ambient containing the dopant as a vapor, by deposition of a layer containing the dopant, by ion implantation of ions containing the dopant, or any combination of the above. In some embodiments, the semiconductor substrate 101 may be heated during exposure to the ambient containing the dopant.

As further shown, the device 100 may include one or more passivation regions 118. In the embodiment shown, the device 100 may be a mesa-type device structure formed by mesa etching the semiconductor substrate 101 and the p-type layer 114 and passivating the P/N junction with a SIPOSlayer 122 patterned to form the passivation region 118. Although only a single passivation region 118 is shown, it will be appreciated that additional passivation regions 118 are present in the device 100. In some embodiments, an oxide-nitride-oxygen (ONO) layer 124 may be formed (e.g., deposited) over the SIPOSlayer 122. As shown, the SIPOSlayer 122 and the ONO layer 124 may partially extend along an upper surface 126 of the p-type layer 114. By providing passivation region 118 with the SIPOSlayer 122 and the ONO layer 124, as opposed to a glass passivation layer, damage to the device 100 from cracking may be eliminated or significantly reduced.

Figure 2:
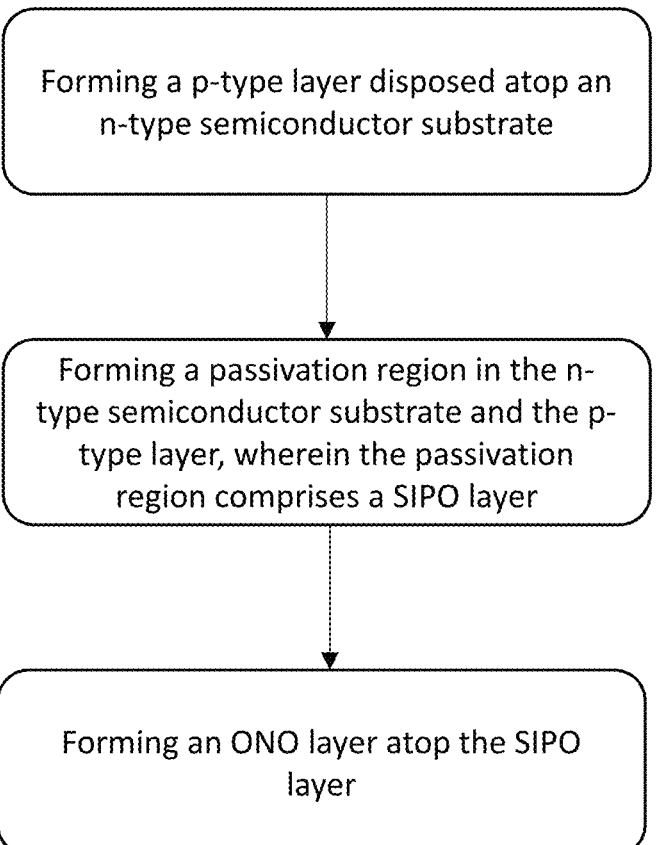
FIG. 2 illustrates a method for forming an overvoltage protection device according to embodiments of the present disclosure.

Turning now to FIG. 2, a method 200 of forming the device 100 will be described. At block 201, the method 200 may include forming a p-type layer atop an n-type semiconductor substrate.

At block 202, the method 200 may include forming a passivation region in the n-type semiconductor substrate and the p-type layer, wherein the passivation region comprises a semi-insulating polycrystalline silicon (SIPOS) layer. In some embodiments, the passivation region is formed by etching the n-type semiconductor substrate and the p-type layer, and then depositing the SIPOSlayer over the etched area.

At block 203, the method 200 may include forming an oxide-nitride-oxide (ONO) layer atop the SIPOSlayer. In some embodiments, the ONO layer is formed by a low-temperature deposition.

The foregoing discussion has been presented for purposes of illustration and description and is not intended to limit the disclosure to the form or forms disclosed herein. For example, various features of the disclosure may be grouped together in one or more aspects, embodiments, or configurations for the purpose of streamlining the disclosure. However, it should be understood that various features of the certain aspects, embodiments, or configurations of the disclosure may be combined in alternate aspects, embodiments, or configurations. Moreover, the following claims are hereby incorporated into this Detailed Description by this reference, with each claim standing on its own as a separate embodiment of the present disclosure.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

The use of "including," "comprising," or "having" and variations thereof herein is meant to encompass the items listed thereafter and equivalents thereof as well as additional items. Accordingly, the terms "including," "comprising," or "having" and variations thereof are open-ended expressions and can be used interchangeably herein.

The phrases "at least one", "one or more", and "and/or", as used herein, are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

All directional references (e.g., proximal, distal, upper, lower, upward, downward, left, right, lateral, longitudinal, front, back, top, bottom, above, below, vertical, horizontal, radial, axial, clockwise, and counterclockwise) are only used for identification purposes to aid the reader's understanding of the present disclosure, and do not create limitations, particularly as to the position, orientation, or use of this disclosure. Connection references (e.g., attached, coupled, connected, and joined) are to be construed broadly and may include intermediate members between a collection of elements and relative movement between elements unless otherwise indicated. As such, connection references do not necessarily infer that two elements are directly connected and in fixed relation to each other.

Furthermore, identification references (e.g., primary, secondary, first, second, third, fourth, etc.) are not intended to connote importance or priority, but are used to distinguish one feature from another. The drawings are for purposes of illustration only and the dimensions, positions, order and relative sizes reflected in the drawings attached hereto may vary.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. An overvoltage protection device, comprising:
an n-type semiconductor substrate;
a p-type layer disposed atop the n-type semiconductor substrate;

a passivation region formed in the n-type semiconductor substrate and the p-type layer, wherein the passivation region comprises a semi-insulating polycrystalline silicon (SIPOS) layer; and an oxide-nitride-oxide (ONO) layer atop the SIPOS layer, wherein no portion of the ONO layer is formed directly atop a top surface of the p-type layer.

2. The overvoltage protection device of claim 1, wherein the SIPOS layer extends partially along the top surface of the p-type layer.

3. A method of forming an overvoltage protection device, the method comprising:

forming a p-type layer atop an n-type semiconductor substrate;

forming a passivation region in the n-type semiconductor substrate and the p-type layer, wherein the passivation region comprises a semi-insulating polycrystalline silicon (SIPOS) layer; and forming an oxide-nitride-oxide (ONO) layer atop the SIPOS layer without forming the ONO layer directly atop a top surface of the p-type layer.

4. The method of claim 3, further comprising forming the SIPOS layer partially along the top surface of the p-type layer.

* * * * *